(12) United States Patent
Yamashita

(10) Patent No.: US 7,253,760 B2
(45) Date of Patent: Aug. 7, 2007

(54) METHOD FOR ADJUSTING SIGNAL GENERATOR AND SIGNAL GENERATOR

(75) Inventor: Katsuya Yamashita, Tokyo (JP)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/445,368

(22) Filed: Jun. 1, 2006

(65) Prior Publication Data

US 2007/0013568 A1   Jan. 18, 2007

(30) Foreign Application Priority Data

Jul. 13, 2005  (JP) .............................. 2005-203894

(51) Int. Cl.
*H03M 1/66*   (2006.01)
(52) U.S. Cl. ...................... 341/144; 341/145
(58) Field of Classification Search ................ 341/144, 341/145, 147
See application file for complete search history.

(56) References Cited

U.S. PATENT DOCUMENTS

| | | | |
|---|---|---|---|
| 6,356,224 B1 * | 3/2002 | Wohlfarth | 341/147 |
| 6,801,145 B2 | 10/2004 | Asami | 341/118 |
| 6,836,235 B2 | 12/2004 | Asami | 341/155 |
| 2005/0116851 A1 * | 6/2005 | Clara et al. | 341/144 |

FOREIGN PATENT DOCUMENTS

| | | |
|---|---|---|
| JP | 05-276036 | 10/1993 |
| JP | 11-195988 | 7/1999 |

* cited by examiner

*Primary Examiner*—Rexford Barnie
*Assistant Examiner*—Joseph Lauture
(74) *Attorney, Agent, or Firm*—Ohlandt, Greeley, Ruggiero & Perle, L.L.P.

(57) ABSTRACT

Monitoring a spectrum of an inter-leaved signal by a signal generator which inter-leaves two DAC outputs with the same sampling rate, while adjusting the output offset level of each DAC, the output amplitude level of each DAC, the output selection timing of each DAC, and the output renewal timing of each DAC.

20 Claims, 10 Drawing Sheets

METHOD FOR ADJUSTING SIGNAL GENERATOR AND SIGNAL GENERATOR

FIELD OF THE INVENTION

The present invention pertains to digital-to-analog conversion technology and in particular, to inter-leaved digital-to-analog conversion technology.

DISCUSSION OF THE BACKGROUND ART

A high-speed digital-to-analog converter is needed for the high-speed generation of waveforms as necessary. The digital-to-analog converters with the fastest conversion rate made by an available art are difficult to obtain because they are not on the general market and they are very expensive when compared to commercial products. Therefore, digital-to-analog conversion devices are inter-leaved in order to avoid such problems (for instance, refer to U.S. Pat. No. 6,356,224). This inter-leaving has an advantage in that a commercial digital-to-analog converter that has a relatively low conversion rate and is inexpensive can be used. Conventional converters are also set forth in the following: JP Unexamined Patent Application (Kokai) 5-276,036, JP Unexamined Patent Application (Kokai) 11-195,988, JP Unexamined Patent Application (Kokai) 2002-217,732, and JP Unexamined Patent Application (Kokai) 2002-246,910.

On the other hand, the following problems can occur with inter-leaving. For instance, there are cases wherein, although it is small, there is a difference in performance between inter-leaved digital-to-analog converters. Moreover, even though inter-leaved digital-to-analog converters momentarily have exactly the same properties, it is difficult to always maintain this state. Furthermore, there are cases wherein the output signals of digital-to-analog converters cannot be switched at uniform intervals. That is, by means of conventional inter-leaving, signal precision is sacrificed for high-speed conversion. Therefore, an object of the present invention is to provide technology for generating signals with less distortion than in the past.

SUMMARY OF THE INVENTION

Therefore, by means of the present invention, the signal spectrum after inter-leaving in a signal generator is monitored while adjusting the output offset level of each DAC, the output amplitude level of each DAC, the output selection timing of each DAC, and the output renewal timing of each DAC. The present invention is a method for the adjustment of a signal generator for inter-leaving a first digital-to-analog converter and a second digital-to-analog converter operated under the same sampling rate and outputting signals obtained by synthesizing the output signals of the first and the second digital-to-analog converters, characterized in that it comprises a first step for adjusting the output offset of these first and second digital-to-analog converters such that when a direct current of the same level has been output from the first and second digital-to-analog converters, or when signals that do not contain a frequency component of this sampling rate have been output as these synthesized signals, the level in the spectrum of these synthesized signals of the frequency component that is the same as this sampling rate becomes lower than a first predetermined level or becomes the minimum, and a second step for adjusting the output level of these first and second digital-to-analog converters such that when signals of a first predetermined frequency have been output as these synthesized signals, the level in the spectrum of these synthesized signals becomes the same for two frequency components separated by this first predetermined frequency from the frequency that is the same as this sampling rate; the difference between these two levels becomes less than a second predetermined value or becomes the minimum; or the sum of these two levels becomes less than a third predetermined value or becomes the minimum, wherein the second step is repeated until the signal integrity value, when signals of the second predetermined frequency have been output as synthesized signals, satisfies a predetermined condition, e.g., less than a fourth predetermined level or becomes the minimum.

The method of the present invention may further comprise a third step for adjusting timing by which the output signals of said first digital-to-analog converter are renewed such that when signals of a third predetermined frequency have been output from this first digital-to-analog converter and a direct current has been output from this second digital-to-analog converter, the level of this third frequency component becomes the maximum in the spectrum of these synthesized signals, and a fourth step for adjusting timing by which the output signals of this second digital-to-analog converter are renewed such that when a direct current has been output from this first digital-to-analog converter and signals of a fourth predetermined frequency are output from this second digital-to-analog converter, the level of this fourth predetermined frequency component in the spectrum of these synthesized signals becomes the maximum, wherein these second, third, and fourth steps are repeated until the signal integrity value, when signals of this second predetermined frequency have been output as synthesized signals, satisfies a predetermined condition, e.g., less than this fourth predetermined value or becomes the minimum.

Preferably, the third step comprises adjusting the phase of clock signals applied to this first digital-to-analog converter in order to adjust this timing, and this fourth step comprises adjusting the phase of clock signals applied to this second digital-to-analog converter in order to adjust this timing.

This method may further comprise a fifth step for adjusting timing by which are selected the output signals of these first and second digital-to-analog converters such that when signals of a fifth predetermined frequency have been output as these synthesized signals, the level in the spectrum of these synthesized signals becomes less than a fifth predetermined level or becomes the minimum for two frequency components that are separated by this fifth predetermined frequency from the frequency component that is the same as this sampling rate, wherein these second, third, fourth, and fifth steps are repeated until this signal integrity satisfies a predetermined condition, e.g., less than this fourth predetermined value or becomes the minimum.

Preferably, the signal generator has a selector for selecting the output signals of these first and second digital-to-analog converters, and the fifth step comprises changing the duty ratio of the signals applied to this selector for this selecting.

Preferably, the first step is also repeated until the signal integrity value, when signals of a second predetermined frequency have been output as these synthesized signals, satisfies a predetermined condition, e.g., less than a fourth predetermined value or becomes the minimum.

Another embodiment according to the present invention includes a method for the adjustment of a signal generator for inter-leaving a first and a second digital-to-analog converter that operate under the same sampling frequency and outputting signals obtained by synthesizing output signals of these first and second digital-to-analog converters, characterized in that it comprises a step for adjusting the output offset of these first and second digital-to-analog converters such that when a direct current of the same level is output from these first and second digital-to-analog converters, or when signals that do not contain a frequency component of this sampling rate are output as these synthesized signals, the level in the spectrum of these synthesized signals of the frequency component that is the same as this sampling rate becomes less than a predetermined value or becomes the minimum.

Still yet another embodiment according to the present invention is a method for the adjustment of a signal generator for inter-leaving a first and a second digital-to-analog converter that operate under the same sampling rate and outputting signals obtained by synthesizing the output signals of these first and second digital-to-analog converters, characterized in that it comprises a step for adjusting the output level of these first and second digital-to-analog converters such that when signals of a predetermined frequency have been output as these synthesized signals, the level in the spectrum of the synthesized signals becomes the same for two frequency components separated by this predetermined frequency from the frequency that is the same as this sampling rate; the difference between these two levels becomes less than a first predetermined value or becomes the minimum; or the sum of these two levels becomes less than a second predetermined value or becomes the minimum.

Another embodiment includes a method for the adjustment of a signal generator for inter-leaving a first and a second digital-to-analog converter that operate under the same sampling rate and outputting signals obtained by synthesizing the output signals of these first and second digital-to-analog converters, characterized in that it comprises a step for adjusting the timing with which are selected the output signals of these first and second digital-to-analog converters such that when signals of a predetermined frequency have been output as synthesized signals, the level in the spectrum of these synthesized signals of two frequency components separated by this predetermined frequency from the frequency that is the same as this sampling rate becomes less than a predetermined value or becomes the minimum.

A further embodiment includes a method for the adjustment of a signal generator for inter-leaving a first and a second digital-to-analog converter that operate under the same sampling rate and outputting signals obtained by synthesizing the output signals of these first and second digital-to-analog converters, characterized in that it comprises a third step for adjusting timing by which the output signals of the first digital-to-analog converter are renewed such that when signals of a first predetermined frequency have been output from this first digital-to-analog converter and a direct current has been output from this second digital-to-analog converter, the level of this first predetermined frequency component in the spectrum of these synthesized signals becomes the maximum; and a fourth step for adjusting the timing by which the output signals of this second digital-to-analog converter are renewed such that when a direct current has been output from this first digital-to-analog converter and signals of a second predetermined frequency have been output from this second digital-to-analog converter, the level of this second predetermined frequency component in the spectrum of these synthesized signals becomes the maximum.

The present invention also includes a device that is a signal generator for inter-leaving a first and a second digital-to-analog converter that operate under the same sampling rate and outputting signals obtained by synthesizing the output signals of these first and second digital-to-analog converters, characterized in that it has a control device that executes a first step for adjusting the output offset of these first and second digital-to-analog converters such that when a direct current of the same level has been output from these first and second digital-to-analog converters, or signals that do not contain a frequency component of this sampling rate have been output as synthesized signals, the level in the spectrum of these synthesized signals of the frequency component that is the same as this sampling rate becomes lower than a first predetermined value or becomes the minimum, and a second step for adjusting the output level of these first and second digital-to-analog converters such that when signals of a first predetermined frequency have been output as these synthesized signals, the level in the spectrum of the synthesized signals is the same for two frequency components separated by this predetermined frequency from the frequency that is the same as this sampling rate; the difference between these two levels becomes less than the first predetermined value or becomes the minimum; or the sum of these two levels becomes less than a second predetermined value or becomes the minimum, wherein this second step is repeated until the signal integrity value, when signals of a second predetermined frequency have been output as these synthesized signals, satisfies a predetermined condition, e.g., less than a fourth predetermined value or becomes the minimum.

The control device of the present invention may also execute a third step for adjusting the timing by which output signals of this first digital-to-analog converter are renewed such that when signals of a third predetermined frequency have been output from this first digital-to-analog converter and a direct current has been output from this second digital-to-analog converter, the level of this third predetermined frequency in the spectrum of these synthesized signals becomes the maximum and a fourth step for adjusting the timing by which output signals of this second digital-to-analog converter are renewed such that when a direct current has been output from this first digital-to-analog converter and signals of a fourth predetermined frequency have been output from this second digital-to-analog converter, the level of this fourth predetermined frequency component in the spectrum of these synthesized signals becomes the maximum, wherein these second, third, and fourth steps are repeated until the signal integrity value, when signals of this second predetermined frequency have been output as these synthesized signals, satisfies a predetermined condition, e.g., less than this fourth predetermined value or becomes the minimum.

The third step typically comprises adjusting the phase of clock signals applied to this first digital-to-analog converter in order to adjust this timing, and this fourth step comprises adjusting the phase of clock signals applied to this second digital-to-analog converter in order to adjust this timing.

The control device further executes a fifth step for adjusting timing by which are selected the output signals of these first and second digital-to-analog converters such that when signals of a fifth predetermined frequency have been output as these synthesized signals, the level in the spectrum of these synthesized signals becomes lower than a fifth predetermined level or becomes the minimum for two frequency components that are separated by this fifth predetermined frequency from the frequency component that is the same as this sampling rate, wherein these second, third, fourth, and fifth steps are repeated until this signal integrity value satisfies a predetermined condition, e.g., less than this fourth predetermined value or becomes the minimum.

The signal generator has a selector for selecting the output signals of these first and second digital-to-analog converters, and this fifth step comprises changing the duty ratio of the signals applied to this selector for this selecting.

Optionally, the first step is repeated until the signal integrity when signals of a second predetermined frequency have been output as these synthesized signals satisfies a predetermined condition, e.g., less than a fourth predetermined value or becomes the minimum.

The present invention also pertains to a signal generator for inter-leaving a first and a second digital-to-analog converter that operate under the same sampling frequency and outputting signals obtained by synthesizing output signals of these first and second digital-to-analog converters, characterized in that it comprises a control device for adjusting the output offset of these first and second digital-to-analog converters such that when a direct current of the same level is output from these first and second digital-to-analog converters, or when signals that do not contain a frequency component of this sampling rate are output as these synthesized signals, the level in the spectrum of these synthesized signals of the frequency component that is the same as this sampling rate becomes lower than a predetermined value or becomes the minimum.

Another embodiment of the present invention includes a signal generator for inter-leaving a first and a second digital-to-analog converter that operate under the same sampling rate and outputting signals obtained by synthesizing the output signals of these first and second digital-to-analog converters, characterized in that it comprises a control device for adjusting the output level of these first and second digital-to-analog converters such that when signals of a predetermined frequency have been output as these synthesized signals, the level in the spectrum of the synthesized signals becomes the same for two frequency components separated by this predetermined frequency from the frequency that is the same as this sampling rate; the difference between these two levels becomes less than a first predetermined value or becomes the minimum; or the sum of these two levels becomes less than a second predetermined value or becomes the minimum.

Still yet a further embodiment includes a signal generator for inter-leaving a first and a second digital-to-analog converter that operate under the same sampling rate and outputting signals obtained by synthesizing the output signals of these first and second digital-to-analog converters, characterized in that it comprises a control device for adjusting the timing with which are selected the output signals of these first and second digital-to-analog converters such that when signals of a predetermined frequency have been output as synthesized signals, the level in the spectrum of these synthesized signals of two frequency components separated by this predetermined frequency from the frequency that is the same as this sampling rate becomes lower than a predetermined value or becomes the minimum.

A further embodiment includes a signal generator for inter-leaving a first and a second digital-to-analog converter that operate under the same sampling rate and outputting signals obtained by synthesizing the output signals of these first and second digital-to-analog converters, characterized in that it comprises a control device that executes a step for adjusting timing by which the output signals of this first digital-to-analog converter are renewed such that when signals of a first predetermined frequency have been output from this first digital-to-analog converter and a direct current has been output from this second digital-to-analog converter, the level of this first predetermined frequency component in the spectrum of these synthesized signals becomes the maximum; and a fourth step for adjusting the timing by which the output signals of this second digital-to-analog converter are renewed such that when a direct current has been output from this first digital-to-analog converter and signals of a second predetermined frequency have been output from this second digital-to-analog converter, the level of this second predetermined frequency component in the spectrum of these synthesized signals becomes the maximum.

By means of the present invention, it is possible to generate signals with less distortion that in the past by inter-leaved digital-to-analog conversion.

DETAILED DESCRIPTION OF THE PREFERRED EMBODIMENT

Figure 1:
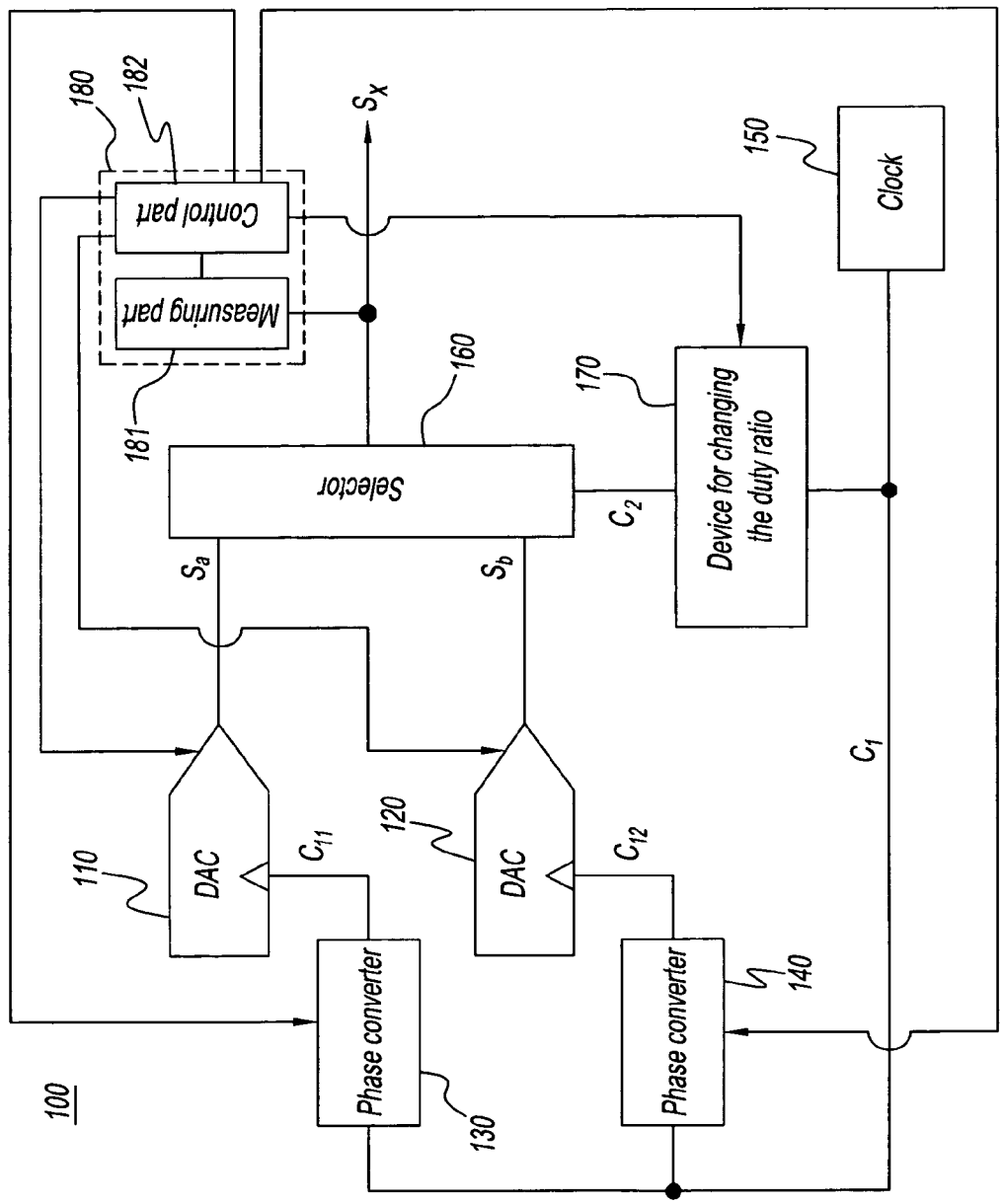
FIG. 1 is a block diagram showing the internal structure of signal generator 100.

Embodiments of the present invention will now be described while referring to the attached drawings. The first embodiment of the present invention is a signal generator 100. Refer to FIG. 1. FIG. 1 is a block drawing showing the internal structure of signal generator 100. Signal generator 100 comprises a digital-to-analog converter 110, a digital-to-analog converter 120, a phase converter 130, a phase converter 140, a clock signal source 150, a selector 160, a device 170 for changing the duty ratio, and a compensator 180. The digital-to-analog converter in the drawing is indicated by DAC. The clock signal source is shown by the clock block.

Clock signal source 150 is a device for generating clock signals $C_1$ having a frequency of 5 GHz. Clock signals $C_1$ are applied to DAC 110 via phase converter 130; DAC 120 via phase converter 140; and selector 160 via a device 170 for changing the duty ratio. Phase converters 130 and 140 are devices for converting the phase of the input signals by a specific angle and outputting the conversion results. Phase converters 130 and 140 change the amount of phase conversion in response to outside control. Device 170 for changing the duty ratio is a device for adjusting the duty ratio of input signals and outputting the adjustment results $C_2$. Output signal $S_a$ of DAC 110 and output signal $S_b$ of DAC 120 are applied to selector 160. DAC 110 and DAC 120 adjust the level and offset of output signals $S_a$ and $S_b$ under outside control. Adjustment of the level here means that the amplitude level of the output signals is adjusted without adjusting the digital data or the digital data stream that will be given to the DAC. Selector 160 is the device for selecting either output signal $S_a$ or $S_b$ in accordance with the output signal level of device 170 for changing the duty ratio and outputting the selected signals. By means of the present embodiment, selector 160 outputs output signal $S_a$ when the logic level of clock signal $C_2$ is L and outputs output signal $S_b$ when the logic level of clock signal $C_2$ is H. As a result, synthesized signals $S_x$ that include either output signal $S_a$ or $S_b$ are generated based upon the output of selector 160. Compensator 180 is the device that monitors output signals $S_x$ of the selector and controls other devices based on these results. Compensator 180 comprises a measuring part 181 for analyzing the spectrum of output signals $S_x$ of the selector and a control part 182 for controlling the outside devices based on the analysis results of measuring part 181. The spectrum analysis system of measuring part 181 can be a Fourier transform system such as used in an FFT analyzer, or a sweep system such as used in a spectrum analyzer. Control part 182 controls DAC 110, DAC 120, phase converter 130, phase converter 140, and device 170 for changing the duty ratio.

Figure 2:
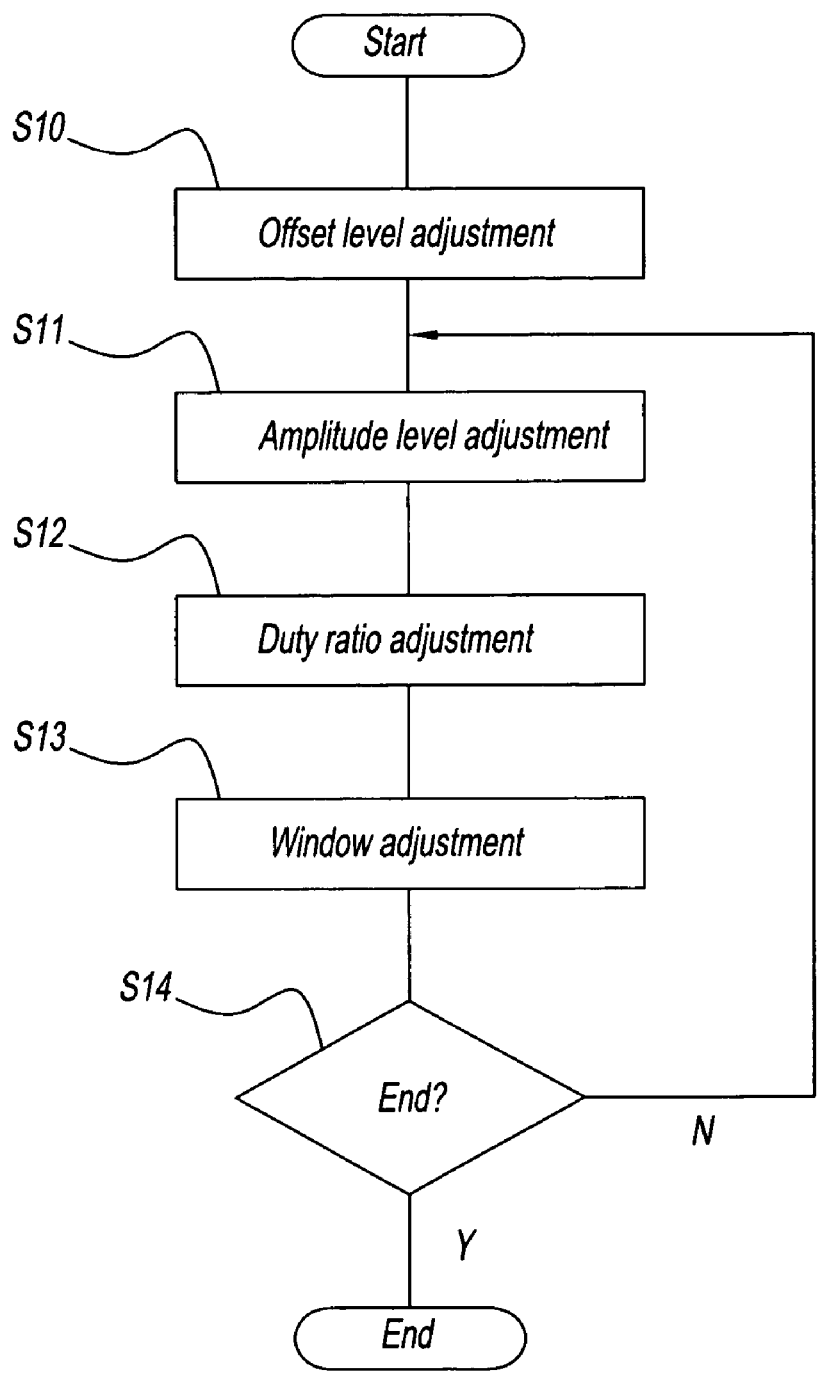
FIG. 2 is a flow chart showing the procedure for improving the signal integrity of synthesized signals $S_x$.

Next, the procedure for adjusting signal generator 100 and increasing the signal integrity of synthesized signals $S_x$ will be described. Degradation of signal integrity of synthesized signals $S_x$ occurs as a result of mismatching of the amplitude level between DACs, mismatching of the offset level between the DACs, or mistiming of selection of the output signals of a DAC by selector 160. Consequently, the present invention adjusts each structural unit and each signal inside signal generator 100 while monitoring the spectrum of synthesized signals $S_x$. Refer to FIG. 2 as well as FIG. 1. FIG. 2 is a flow chart showing the procedure by which the signal integrity of synthesized signals $S_x$ is improved.

Figure 3:
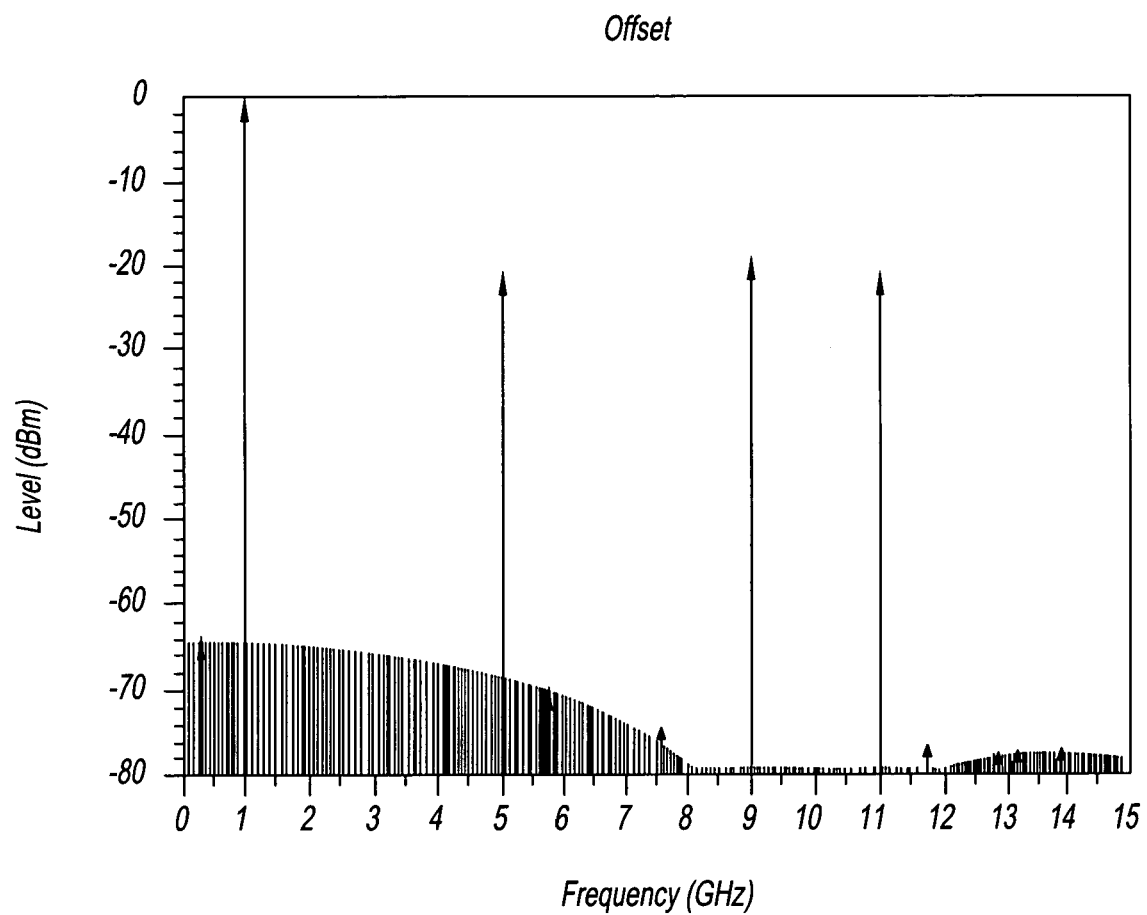
FIG. 3 is the spectrum of synthesized signals $S_x$.

First, in step S10, control part 182 adjusts the output offset levels of DAC 110 and DAC 120 such that the frequency component that is the same 5 GHz that is the sampling rate of DAC 110 and DAC 120 becomes less than the predetermined value $TH_1$ or becomes the minimum in the spectrum of synthesized signals $S_x$ analyzed by measuring part 181. DAC 110 and DAC 120 at this time output a direct current of the same level or alternating current signals wherein synthesized signals $S_x$ do not contain a 5 GHz component. Refer to FIG. 3. FIG. 3 is the spectrum of synthesized signals $S_x$ when the offset level is mismatched between DAC 110 and DAC 120. It is clear from FIG. 3 that 5 GHz is an unnecessary component. By means of this step, the level of the component of this 5 GHz is lower than the predetermined value $TH_1$.

Figure 4:
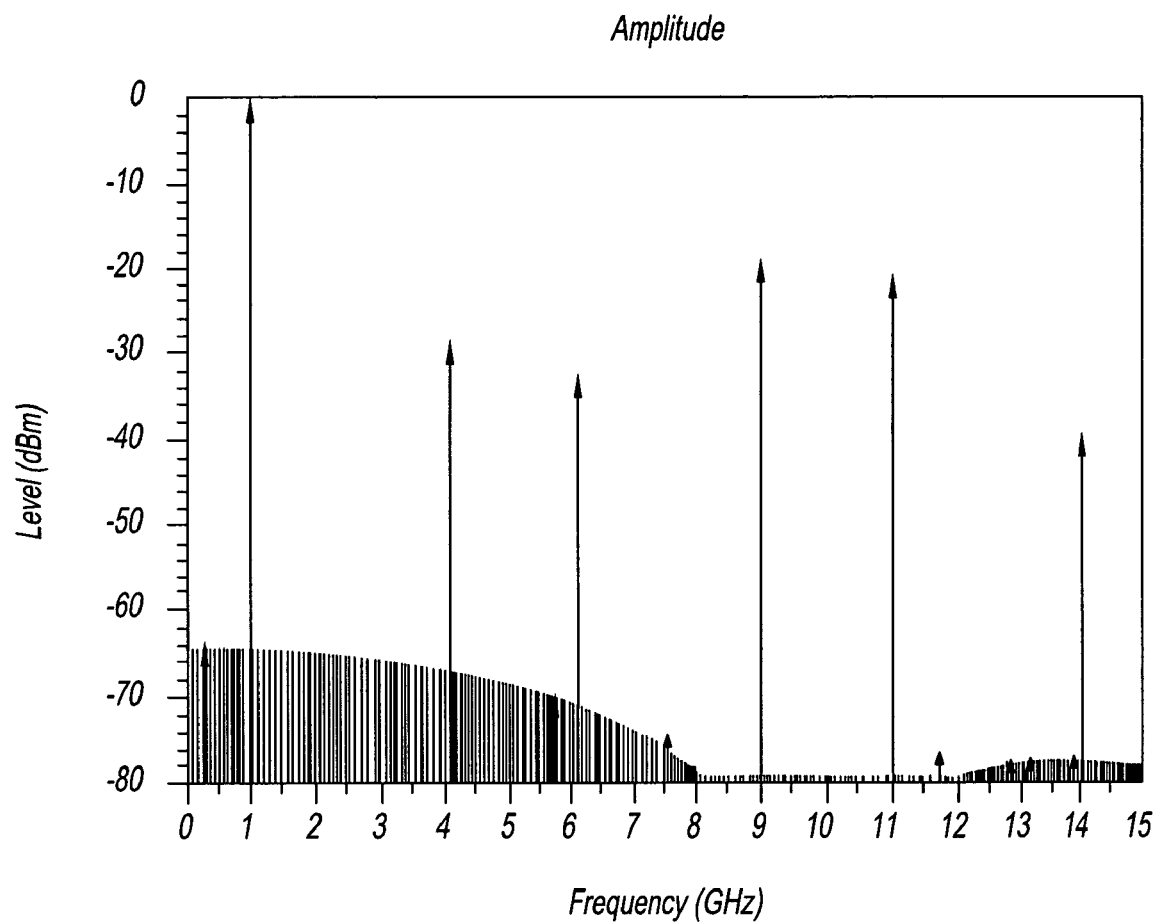
FIG. 4 is the spectrum of synthesized signals $S_x$.

Next, in step S11, a sine wave of 1 GHz is output to signal generator 100 as synthesized signal $S_x$. Moreover, control part 182 adjusts the output amplitude levels of DAC 110 and DAC 120 such that the level in the spectrum of synthesized signals $S_x$ analyzed by measuring part 181 is the same for two frequency components (4 GHz, 6 GHz) separated by 1 GHz (frequency of synthesized signal $S_x$) from 5 GHz (sampling rate); the difference between these two levels becomes less than predetermined value $TH_2$ or becomes the minimum; or the sum of these two levels becomes less than predetermined value $TH_3$ or becomes the minimum. Refer to FIG. 4. FIG. 4 is the spectrum of synthesized signal $S_x$ in the case where the amplitude levels are mismatched between DAC 110 and DAC 120 when 1 GHz has been output as synthesized signal $S_x$. It is clear from FIG. 4 that 4 GHz and 6 GHz are unnecessary components. By means of this step, the levels of these two components are adjusted so that they are the same.

Figure 5:
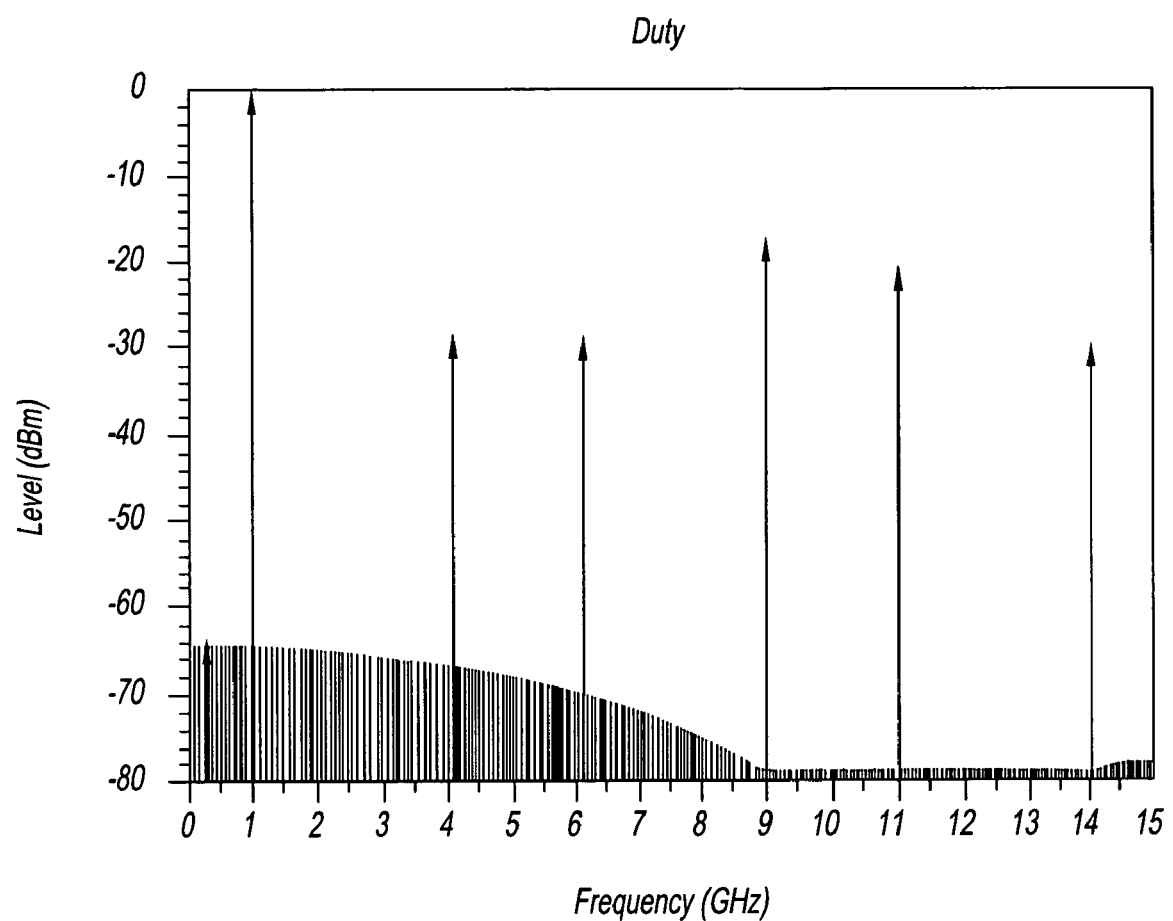
FIG. 5 is the spectrum of synthesized signals $S_x$.

Next, in step S12, control part 182 adjusts the timing by which output signals $S_a$ and $S_b$ are selected so that, in the spectrum of the synthesized signals $S_x$ analyzed by measuring part 181, the level of the two frequency components (4 GHz, 6 GHz) separated by 1 GHz (frequency of synthesized signal $S_x$) from 5 GHz (sampling rate) becomes less than predetermined value $TH_4$ or becomes the minimum. In continuation with step S11, signal generator 100 at this time outputs sine waves of 1 GHz. Specifically, the duty ratio of clock signal $C_1$ is adjusted. Selector 160 must switch between output signal $S_a$ and output signal $S_b$ at equal time intervals. For instance, when selector 160 is operating under ideal conditions, the duty ratio of the clock signals applied to selector 160 must be 50%. However, there are cases in which the duty ratio of the clock signals change by the time they reach selector 160. Therefore, by means of this step, the duty ratio of clock signals $C_1$ is adjusted by device 170 for changing the duty ratio such that the duty ratio of clock signals becomes 50% when they reach selector 160. Refer to FIG. 5. FIG. 5 is the spectrum of synthesized signals $S_x$ in the case where the switching interval between the output signals of DAC 110 and the output signals of DAC 120 was not uniform when 1 GHz was output as synthesized signal $S_x$. It is clear from FIG. 5 that 4 GHz and 6 GHz are unnecessary components. By means of this step, the level of these frequency components is less than predetermined value $TH_4$.

Next, window adjustment is performed in step S13. Window means the time when input signals are selected by selector 160. By means of this step, the operation of the DAC selected by selector 160 is adjusted such that the selected DAC outputs a level as close as possible to a setting level that is the analog output level indicated by the digital input data, within a predetermined window. When adjusting DAC 110, control part 182 adjusts the timing by which the output signals of DAC 110 are renewed such that the level of 2.5 GHz becomes the maximum in the spectrum of synthesized signals $S_x$ analyzed by measuring part 181, with rectangular waves of 2.5 GHz having been output from DAC 110 and direct current having been output from DAC 120. Phase converter 130 adjusts the timing by adjusting the phase of the clock signals $C_{11}$ that are given to DAC 110.

Figure 6:
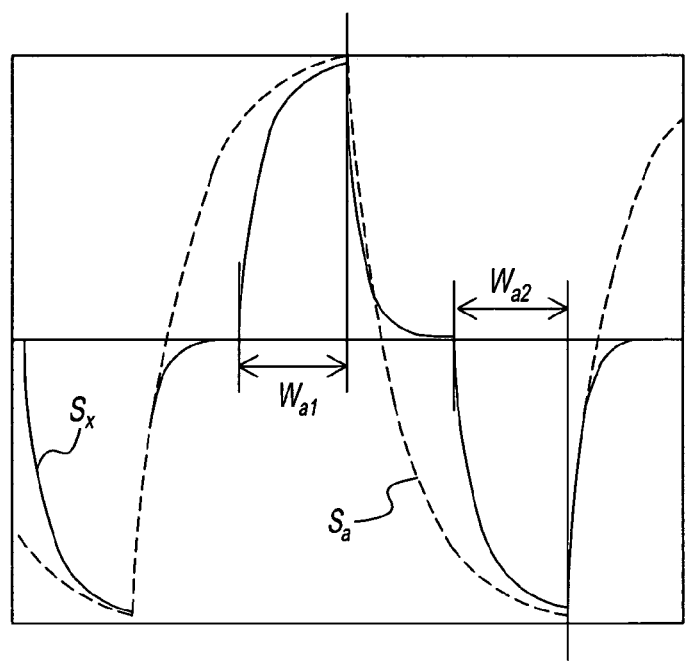
FIG. 6 is a drawing showing signal $S_a$, synthesized signal $S_x$, and the time during which selector 160 selects output signal $S_a$.

The adjustment of DAC 110 will be described again while referring to FIG. 6. FIG. 6 is a drawing showing signals $S_a$ that are output from DAC 110 and input to selector 160, synthesized signals $S_x$ that are output from selector 160, and the time when selector 160 selects output signals $S_a$. Signal $S_b$ output from DAC 120 and input to selector 160 at this time is direct current having a mean level of the amplitude range of signal $S_a$. Signal $S_b$ can be another level, as long as it is a direct current. Digital data are input to DAC 110 such that rectangular waves of 2.5 GHz are output. However, there are cases in which the signals that are actually output from DAC 110 are not perfectly rectangular waves because of performance limitations with DAC 110. As previously described, when the timing by which the output signals of DAC 110 are renewed is adjusted such that the level of 2.5 GHz becomes the maximum in the spectrum of synthesized signals $S_x$, the portion as close as possible to the maximum level of output signal $S_a$ is manifested within window $W_{a1}$, and the portion as close as possible to the minimum level of output signal $S_a$ is manifested within window $W_{a2}$, as shown in FIG. 6.

The adjustment of DAC 120 is the same as the adjustment of DAC 110. That is, control part 182 adjusts the timing by which the output signals of DAC 120 are renewed such that the level of 2.5 GHz is the maximum in the spectrum of synthesized signals $S_x$ analyzed by measuring part 181, with direct current having been output from DAC 110 and a rectangular wave of 2.5 GHz output from DAC 120. Phase converter 140 adjusts the timing by adjusting the phase of clock signals $C_{12}$ given to DAC 120.

Figure 7:
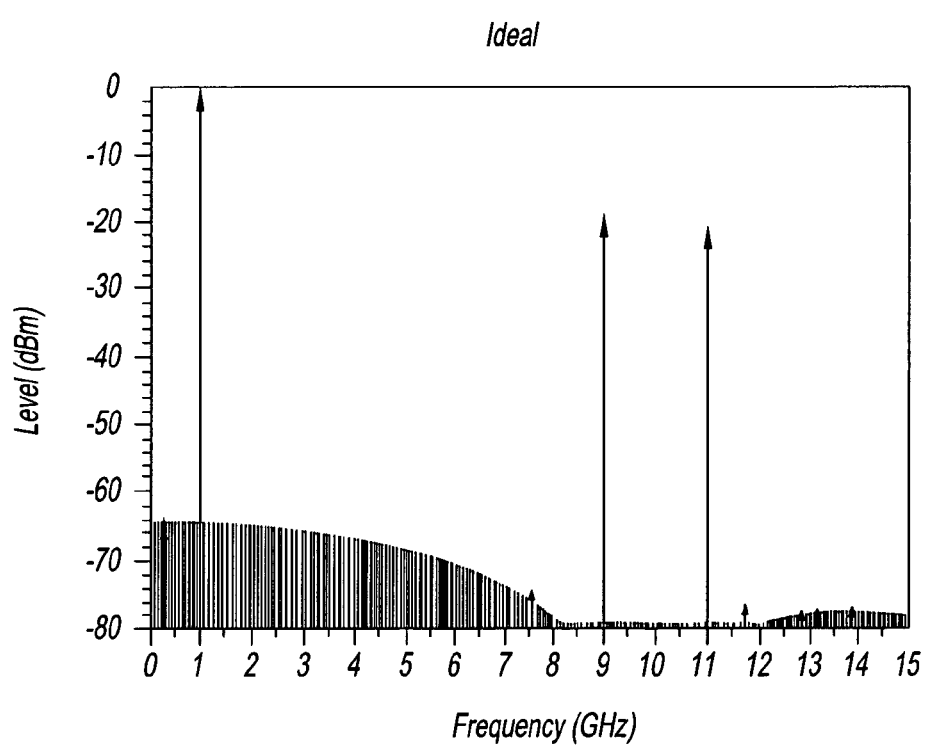
FIG. 7 is the spectrum of synthesized signals $S_x$.

Moreover, if the signal integrity of synthesized signals $S_x$ analyzed by measuring part 181 satisfies a predetermined condition, e.g., a predetermined value of $TH_5$ or greater, the system will return to step S11 and continue processing (Step S14). The system can return to step S10 rather than step S11. The result of the above-mentioned series of processing is an optimal adjustment of signal generator 100 such that synthesized signals $S_x$ of a high signal integrity are obtained as shown in FIG. 7.

However, the frequency of synthesized signal $S_x$ in step S11 and the frequency of synthesized signal $S_x$ in step 12 can be a frequency other than 1 GHz, and the two are not necessarily the same. Moreover, the frequency of signal $S_a$ when adjusting DAC 110 and the frequency of signal $S_b$ when adjusting DAC 120 can be frequencies other than 2.5 GHz and the two are not necessarily the same. Of course, there is probably an advantage to making the frequencies the same because the time needed to set up the DAC is reduced.

Figure 8:
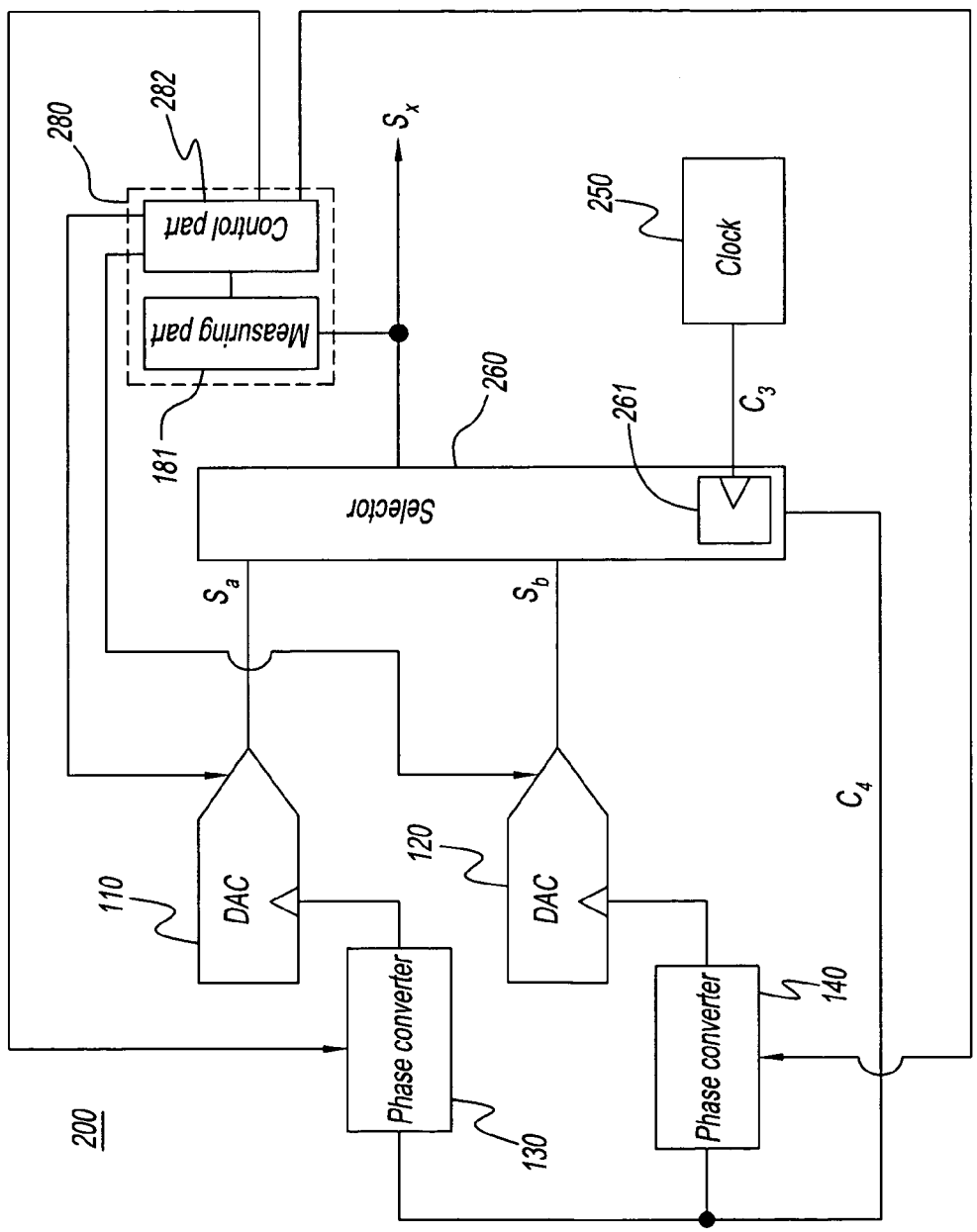
FIG. 8 is a block diagram showing the internal structure of signal generating circuit 200.

A second embodiment of the present invention will now be described. This second embodiment is a signal generator 200. Signal generator 200 is different from signal generator 100 in that there is a frequency divider inside a selector 260. This frequency divider plays a role in adjusting the duty ratio for feeding clock signals to the DAC. Refer to FIG. 8. FIG. 8 is a block diagram showing the internal structure of signal generator 200. The same reference numbers as in FIG. 1 have been used in FIG. 8 for the same structural parts as in FIG. 1 and a detailed description has therefore been omitted. Signal generator 200 comprises a DAC 110, a DAC 120, a phase converter 130, a phase converter 140, a clock signal source 250, a selector 260, and a compensator 280.

Clock signal source 250 is the device for generating clock signal $C_3$ having a frequency of 10 GHz. Clock signal $C_3$ is divided in two by a frequency divider 261 housed inside selector 260 and these frequencies are then applied to DAC 110 via phase converter 130 and DAC 120 via phase converter 140, respectively. Frequency divider 261 comprises, for instance, a T flip-flop, or similar component. Selector 260 is a device for selecting either output signal $S_a$ or output signal $S_b$ in accordance with the level of clock signal $C_4$ output by frequency divider 261, and outputting the selected signal. By means of the present embodiment, selector 260 outputs output signal $S_a$ when the logic level of clock signal $C_4$ is L and outputs output signal $S_b$ when the logic level of clock signal $C_4$ is H. As a result, synthesized signals $S_x$ that include output signals $S_a$ and/or $S_b$ are generated. Compensator 280 is the device for monitoring output signals $S_x$ of the selector and controlling outside devices based on the observation results. Compensator 280 comprises a measuring part 181 for analyzing the spectrum of output signals $S_x$ of the selector and a control part 282 for controlling outside devices based on the analysis results of measuring part 181. Control part 282 controls DAC 110, DAC 120, phase converter 130, and phase converter 140.

Figure 9:
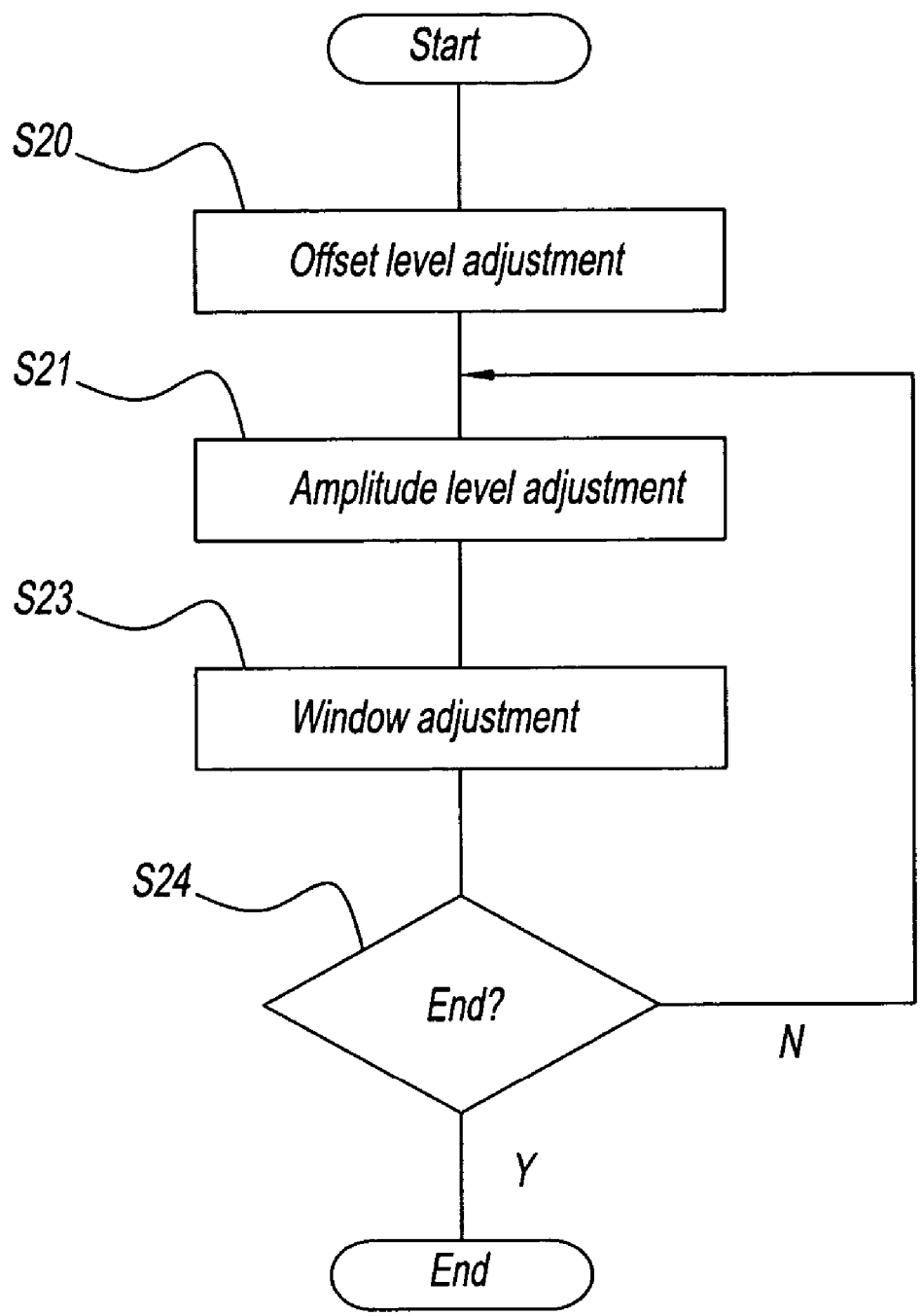
FIG. 9 is a flow chart showing the procedure for improving the signal integrity of synthesized signals $S_x$.

Next, the procedure for adjusting signal generator 200 and increasing the signal integrity of synthesized signals $S_x$ will be described. Degradation of the signal integrity of synthesized signals $S_x$ occurs as a result of mismatching of the amplitude level between DACs, mismatching of the offset level between the DACs, or mistiming of selection of the output signals of a DAC by selector 160. Consequently, the present invention adjusts each structural unit and each signal inside signal generator 200 while monitoring the spectrum of synthesized signals $S_x$. Refer to FIG. 9 in conjunction with FIG. 8. FIG. 9 is a flow chart showing the procedure by which the signal integrity of synthesized signals $S_x$ is improved.

First, in step S20 the offset level is adjusted as in step S10. The description of the processing in step S20 is the same as the description of the processing in step S10 with control part 182 rewritten as control part 282.

Next, the amplitude level is adjusted in step S21 as in step S11. The description of the processing in step S21 is the same as the description of the processing in step S11 with control part 182 rewritten as control part 282. By means of the second embodiment, the clock signal $C_3$ is divided in two by frequency divider 261 and the processing corresponding to step S12 is therefore unnecessary.

Next, window adjustment is performed in step S23 as in step S13. The description of the processing in step S23 is the same as the description of the processing in step S13 with control part 182 rewritten as control part 282.

Moreover, if the signal integrity value of synthesized signals $S_x$ analyzed by measuring part 181 is predetermined value $TH_5$ or greater, they system will return to step S21 and continue processing (Step S24). The system can return to step S20 rather than step S21. The result of the above-mentioned series of processing is an optimal adjustment of signal generator 200 such that synthesized signals $S_x$ of a high signal integrity are obtained as shown in FIG. 7.

By means of the second embodiment, frequency divider 261 can also be positioned outside of selector 260 as long as it is at a distance such that the duty ratio of clock signals $C_4$ that are output does not become irregular. It should be noted that it is necessary to feed clock signals from frequency divider 261 to selector 260, DAC 110, and DAC 120 because the initial phase of clock signal $C_4$ is not confirmed.

Figure 10:
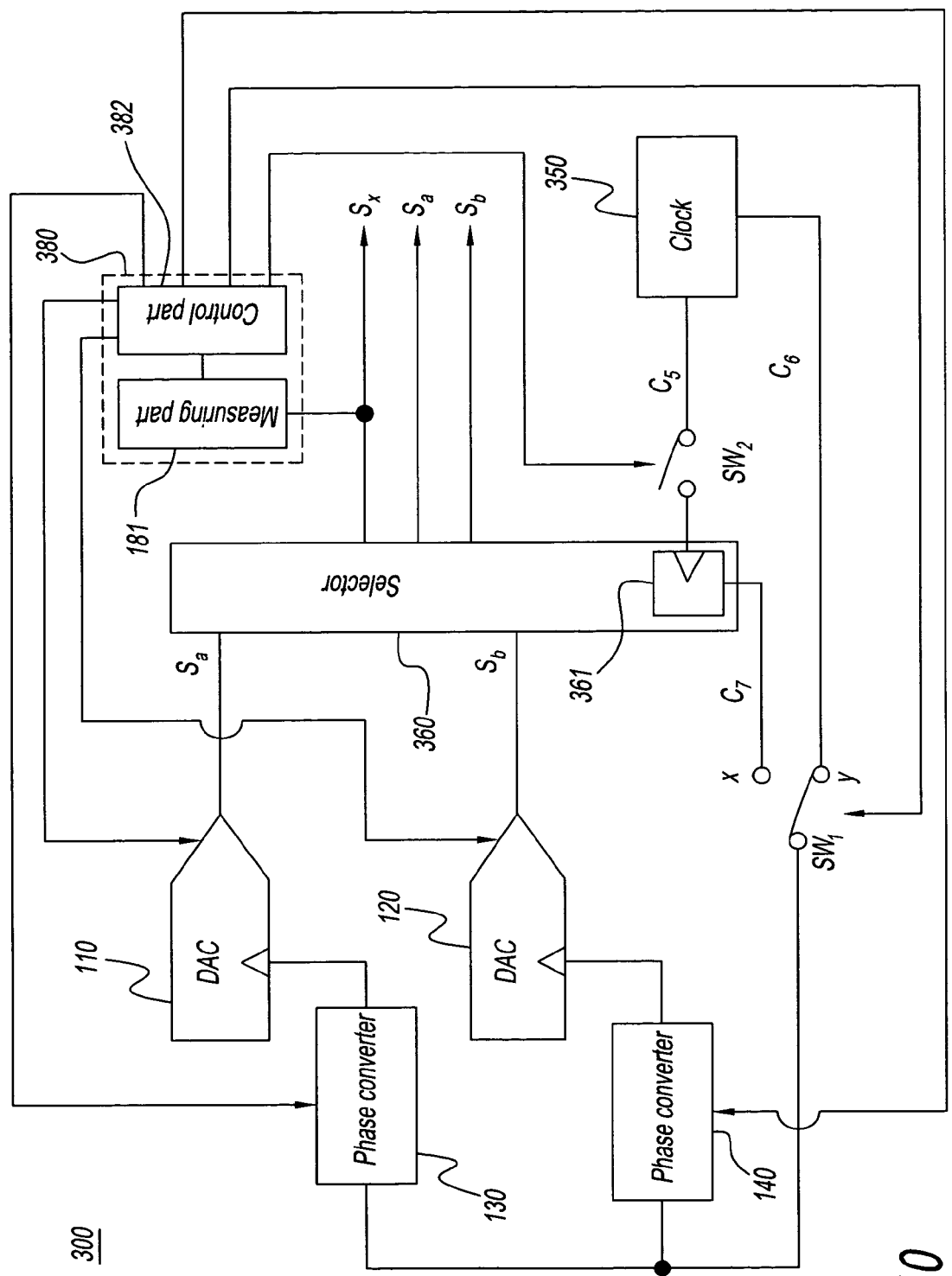
FIG. 10 is a block diagram showing the internal structure of signal generator 300.

A third embodiment of the present invention will now be described. The third embodiment is a signal generator 300. Signal generator 300 differs from signal generator 200 in that selector 160 comprises a through-output. Refer to FIG. 10. FIG. 10 is a block diagram showing the internal structure of signal generator 300. The same reference numbers as in FIG. 8 have been used in FIG. 10 for the same structural parts as in FIG. 8 and a detailed description has therefore been omitted. Signal generator 300 comprises a DAC 110, a DAC 120, a phase converter 130, a phase converter 140, a clock signal source 350, a selector 160, and a compensator 380.

Clock signal source 350 is the device for generating a clock signal $C_5$ having a frequency of 10 GHz and clock signal $C_6$ having a frequency of 5 GHz. When switch $SW_1$ selects the x side and switch $SW_2$ is turned ON, clock signal $C_5$ is divided in two by a frequency divider 361 housed inside selector 360 and these frequencies are then applied to DAC 110 via phase converter 130 and DAC 120 via phase converter 140, respectively. On the other hand, when switch $SW_1$ selects the y side and switch $SW_2$ is turned OFF, clock signals $C_6$ is directly applied to DAC 110 via phase converter 130 and DAC 120 via phase converter 140, respectively. Frequency divider 261 comprises, for instance, a T flip-flop, or a similar component. Selector 360 is a device for selecting either output signal $S_a$ or output signal $S_b$ in accordance with the level of clock signal $C_4$ output by frequency divider 361 and outputting the selected signal. By means of the present embodiment, selector 360 outputs output signal $S_a$ when the logic level of clock signal $C_4$ is L and outputs output signal $S_b$ when the logic level of clock signal $C_2$ is H. As a result, synthesized signals $S_x$ that include output signal $S_a$ and/or $S_b$ are generated. Moreover, selector 360 outputs through-output, that is, outputs signals $S_a$ and $S_b$ that are to be input without further processing when $SW_2$ is turned OFF and clock signal $C_5$ is not introduced. Compensator 380 is the device for monitoring output signals $S_x$ of the selector and controlling outside devices based on the observation results. Compensator 380 comprises a measuring part 181 for analyzing the spectrum of output signals $S_x$ of the selector and control part 382 for controlling outside devices based on the analysis results of measuring part 181. Control part 382 controls DAC 110, DAC 120, switch $SW_1$, and switch $SW_2$.

Figure 11:
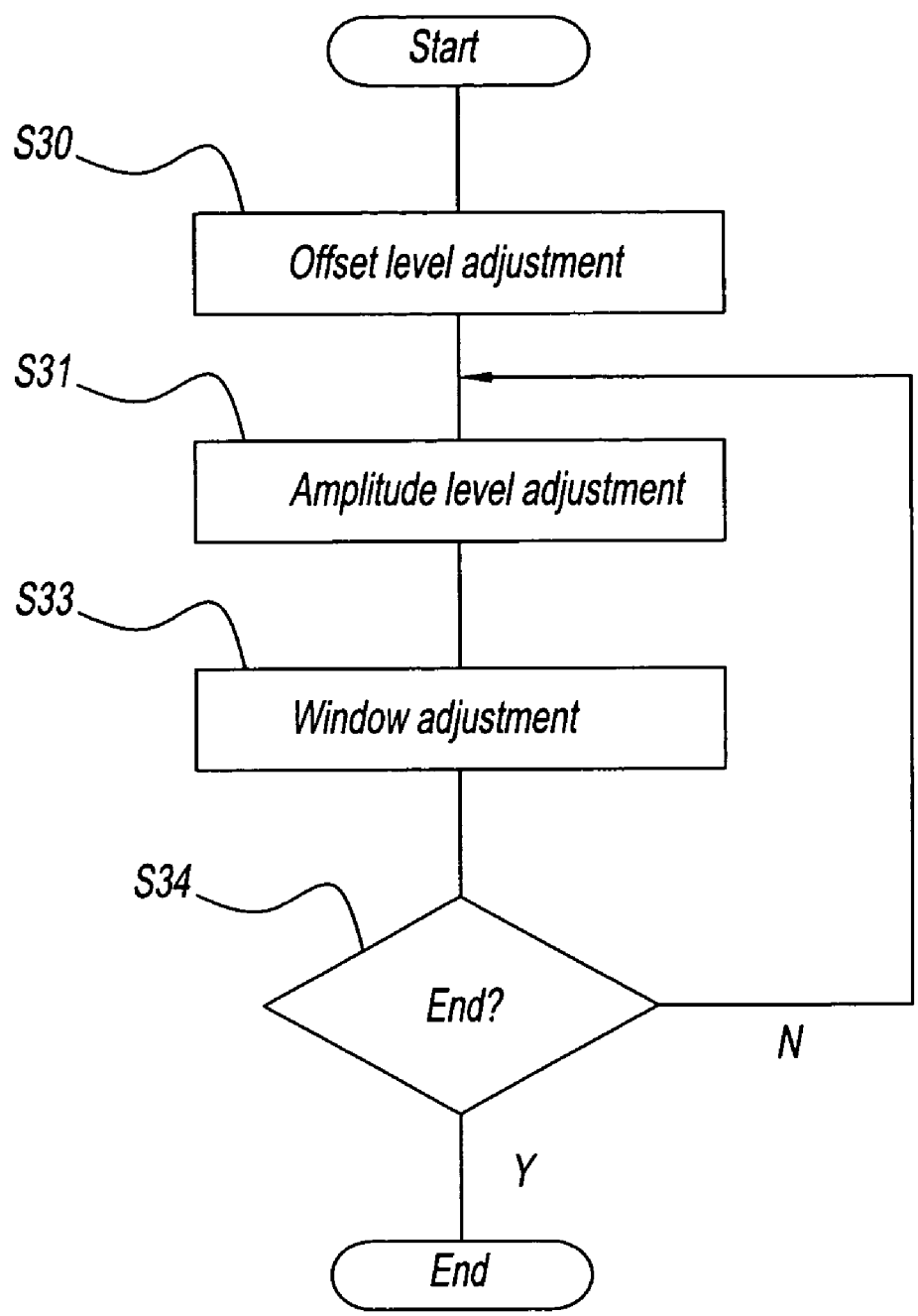
FIG. 11 is a flow chart showing the procedure for improving the signal integrity of synthesized signals $S_x$.

Next, the procedure for adjusting signal generator 300 and increasing the signal integrity of synthesized signals $S_x$ will be described. Degradation of signal integrity of synthesized signals $S_x$ occurs as a result of mismatching of the amplitude level between DACs, mismatching of the offset level between the DACs, or mistiming of switching between the output signals of the DACs. Consequently, the present invention adjusts each structural unit and each signal inside signal generator 300 while monitoring the spectrum of synthesized signals $S_x$. Refer to FIG. 11 as well as FIG. 10. FIG. 11 is a flow chart showing the procedure by which the signal integrity of synthesized signals $S_x$ is improved. Switch $SW_1$ selects the y side and switch $SW_2$ is turned ON by the control implemented by control part 382 for inter-leave operation.

First, in step S30 the offset level is adjusted as in step S20. The description of the processing in step S30 is the same as the description of the processing in step S20 with control part 182 rewritten as control part 382.

Next, the amplitude level is adjusted in step S31 as in step S21. The description of the processing in step S31 is the same as the description of the processing in step S21 with control part 182 rewritten as control part 382. By means of the third embodiment, the clock signal $C_5$ is divided in two by frequency divider 361 and the processing corresponding to step S22 is therefore unnecessary.

Next, window adjustment is performed in step S33 as in step S23. The description of the processing in step S33 is the same as the description of the processing in step S23 with control part 182 rewritten as control part 382.

Moreover, if the signal integrity value of synthesized signals $S_x$ analyzed by measuring part 181 is the predetermined value $TH_5$ or greater, the system will return to step S31 and continue processing (Step S34). The system can return to step S30 rather than step S31. The result of the above-mentioned series of processing is an optimal adjustment of signal generator 300 such that synthesized signals $S_x$ of a high signal integrity are obtained as shown in FIG. 7.

When synthesized signals $S_x$ are such low-frequency signals that inter-leaving of DAC 110 and DAC 120 is not necessary (when signals of 2.5 GHz or lower are output), control part 382 moves switch $SW_1$ to the y side and turns switch $SW_2$ OFF. In this case, selector 360 outputs signals $S_a$ and $S_b$ to be input without further processing. As a result, it is possible to control the generation of unnecessary frequency components that are produced by an inter-leaving operation. Moreover, signals of different types can be output from DAC 110 and DAC 120. Furthermore, when switch $SW_2$ is OFF, one of signals $S_a$ and $S_b$ can be fixed such that the other can be output to the output terminal of synthesized signals $S_x$.

By means of the third embodiment, frequency divider 361 can also be positioned outside of selector 360 as long as it is at a distance such that the duty ratio of clock signals $C_7$ that are output does not become irregular. It should be noted that it is necessary to feed clock signals from frequency divider 361 to selector 360, DAC 110, and DAC 120 because the initial phase of clock signal $C_4$ is not confirmed.

However, the first, second and third embodiments can be modified as follows. By means of the first, second, and third embodiments, control part 182, control part 282 and control part 382 can be individually housed in devices that are to be controlled. For instance, by means of the first embodiment, control part 182 can be housed decentralized between DAC 110, DAC 120, and device 170 for changing the duty ratio. Of course, a partial housing of the control part is also possible, whereby, for instance, the control mechanism relating to device 170 for changing the duty ratio is separated from control part 182 and housed inside device 170 for changing the duty ratio. In such a case, it is necessary for each device that is to be controlled to individually receive the results of spectrum analysis and the measurement results are naturally output from measuring part 181 to device 170 for changing the duty ratio.

The first, second, and third embodiments have described a structure wherein two DACs are inter-leaved. However, the present invention is a signal generator having $2^n$ DACs and can be easily applied to a signal generator wherein the signal path from the output of each DAC to the output of the signal generator has a two-branch structure and there is a selector at the part that corresponds to the joint between two branches. In such a case, the signal generating circuit that inter-leaves two DACs is regarded as one DAC and the procedure described for the first, second, and third embodiments is applied. That is, a signal generating circuit obtained by inter-leaving two signal generating circuits having two DACs is adjusted. Then, the signal generating circuit comprising four DACs is regarded as one DAC and similarly adjusted. By adjusting the circuits in steps in this way, the adjustment of the present invention can be accomplished, even with a structure wherein $2^n$ DACs have been inter-leaved.

What is claimed is:

1. A method for the adjustment of a signal generator for inter-leaving a first digital-to-analog converter and a second digital-to-analog converter operated under the same sampling rate and outputting signals obtained by synthesizing the output signals of the first and the second digital-to-analog converters, wherein said method comprises:

a first step for adjusting the output offset of said first and second digital-to-analog converters such that when a direct current of the same level has been output from the first and second digital-to-analog converters, or when signals that do not contain a frequency component of said sampling rate have been output as said synthesized signals, the level in the spectrum of said synthesized signals of the frequency component that is the same as said sampling rate becomes lower than a first predetermined level or becomes the minimum, and a second step for adjusting the output level of said first and second digital-to-analog converters such that when signals of a first predetermined frequency have been output as said synthesized signals, the level in the spectrum of said synthesized signals becomes the same for two frequency components separated by said first predetermined frequency from the frequency that is the same as said sampling rate; the difference between said two levels becomes less than a second predetermined value or becomes the minimum; or the sum of said two levels becomes less than a third predetermined value or becomes the minimum, wherein the second step is repeated until the signal integrity value, when signals of the second predetermined frequency have been output as synthesized signals, satisfies a predetermined condition.

2. The method according to claim 1, further comprising:
a third step for adjusting timing by which the output signals of said first digital-to-analog converter are renewed such that when signals of a third predetermined frequency have been output from said first digital-to-analog converter and a direct current has been output from said second digital-to-analog converter, the level of said third frequency component becomes the maximum in the spectrum of said synthesized signals, and
a fourth step for adjusting timing by which the output signals of said second digital-to-analog converter are renewed such that when a direct current has been output from said first digital-to-analog converter and signals of a fourth predetermined frequency are output from said second digital-to-analog converter, the level of said fourth predetermined frequency component in the spectrum of said synthesized signals becomes the maximum,
wherein said second, third, and fourth steps are repeated until the signal integrity value when signals of said second predetermined frequency have been output as synthesized signals satisfies a predetermined condition.

3. The method according to claim 2, wherein said third step comprises adjusting the phase of clock signals applied to said first digital-to-analog converter in order to adjust said timing, and said fourth step comprises adjusting the phase of clock signals applied to said second digital-to-analog converter in order to adjust said timing.

4. The method according to claim 1, further comprising:
a fifth step for adjusting timing by which are selected the output signals of said first and said second digital-to-analog converters such that when signals of a fifth predetermined frequency have been output as said synthesized signals, the level in the spectrum of said synthesized signals becomes less than a fifth predetermined level or becomes the minimum for two frequency components that are separated by said fifth predetermined frequency from the frequency component that is the same as said sampling rate,
wherein said second and fifth steps are repeated until said signal integrity satisfies a predetermined condition.

5. The method according to claim 4, wherein said signal generator has a selector for selecting the output signals of said first and said second digital-to-analog converters, and said fifth step comprises changing the duty ratio of the signals applied to said selector for said selecting.

6. The method according to claim 1, wherein said first step is also repeated until the signal integrity value, when signals of a second predetermined frequency have been output as said synthesized signals, satisfies a predetermined condition.

7. A method for the adjustment of a signal generator for inter-leaving a first and a second digital-to-analog converter that operate under the same sampling frequency and outputting signals obtained by synthesizing output signals of said first and said second digital-to-analog converters, said method comprising:
adjusting the output offset of said first and said second digital-to-analog converters such that when a direct current of the same level is output from said first and said second digital-to-analog converters, or when signals that do not contain a frequency component of said sampling rate are output as said synthesized signals, the level in the spectrum of said synthesized signals of the frequency component that is the same as said sampling rate becomes lower than a predetermined value or becomes the minimum.

8. A method for the adjustment of a signal generator for inter-leaving a first and a second digital-to-analog converter that operate under the same sampling rate and outputting signals obtained by synthesizing the output signals of said first and said second digital-to-analog converters, said method comprising:
adjusting the output level of said first and said second digital-to-analog converters such that when signals of a predetermined frequency have been output as said synthesized signals, the level in the spectrum of the synthesized signals becomes the same for two frequency components separated by said predetermined frequency from the frequency that is the same as said sampling rate; the difference between said two levels becomes less than a first predetermined value or becomes the minimum; or the sum of said two levels becomes less than a second predetermined value or becomes the minimum.

9. A method for the adjustment of a signal generator for inter-leaving a first and a second digital-to-analog converter that operate under the same sampling rate and outputting signals obtained by synthesizing the output signals of said first and said second digital-to-analog converters, wherein said method comprises:
adjusting the timing with which are selected the output signals of said first and said second digital-to-analog converters such that when signals of a predetermined frequency have been output as synthesized signals, the level in the spectrum of said synthesized signals of two frequency components separated by said predetermined frequency from the frequency that is the same as said sampling rate becomes lower than a predetermined value or becomes the minimum.

10. A method for the adjustment of a signal generator for inter-leaving a first and a second digital-to-analog converter that operate under the same sampling rate and outputting signals obtained by synthesizing the output signals of said first and said second digital-to-analog converters, said method comprising:
adjusting timing by which the output signals of said first digital-to-analog converter are renewed such that when signals of a first predetermined frequency have been output from said first digital-to-analog converter and a direct current has been output from said second digital-to-analog converter, the level of said first predetermined frequency component in the spectrum of said synthesized signals becomes the maximum; and
adjusting the timing by which the output signals of said second digital-to-analog converter are renewed such that when a direct current has been output from said first digital-to-analog converter and signals of a second predetermined frequency have been output from said second digital-to-analog converter, the level of said second predetermined frequency component in the spectrum of said synthesized signals becomes the maximum.

11. A device that is a signal generator for inter-leaving a first and a second digital-to-analog converter that operate under the same sampling rate and outputting signals obtained by synthesizing the output signals of said first and said second digital-to-analog converters, wherein said device executes the steps comprising:

a first step for adjusting the output offset of said first and said second digital-to-analog converters such that when a direct current of the same level has been output from said first and said second digital-to-analog converters, or signals that do not contain a frequency component of said sampling rate have been output as synthesized signals, the level in the spectrum of said synthesized signals of the frequency component that is the same as said sampling rate becomes lower than a first predetermined value or becomes the minimum, and a second step for adjusting the output level of said first and said second digital-to-analog converters such that when signals of a first predetermined frequency have been output as said synthesized signals, the level in the spectrum of the synthesized signals is the same for two frequency components separated by said predetermined frequency from the frequency that is the same as said sampling rate; the difference between said two levels becomes less than the first predetermined value or becomes the minimum; or the sum of said two levels becomes less than a second predetermined value or becomes the minimum, wherein said second step is repeated until the signal integrity value, when signals of a second predetermined frequency have been output as said synthesized signals, satisfies a predetermined condition.

12. The device according to claim 11, wherein said device further executes:

a third step for adjusting the timing by which output signals of said first digital-to-analog converter are renewed such that when signals of a third predetermined frequency have been output from said first digital-to-analog converter and a direct current has been output from said second digital-to-analog converter, the level of said third predetermined frequency in the spectrum of said synthesized signals becomes the maximum, and a fourth step for adjusting the timing by which output signals of said second digital-to-analog converter are renewed such that when a direct current has been output from said first digital-to-analog converter and signals of a fourth predetermined frequency have been output from said second digital-to-analog converter, the level of said fourth predetermined frequency component in the spectrum of said synthesized signals becomes the maximum, wherein said second, third, and fourth steps are repeated until the signal integrity value, when signals of said second predetermined frequency have been output as said synthesized signals, satisfies a predetermined condition.

13. The device according to claim 12, wherein said third step comprises adjusting the phase of clock signals applied to said first digital-to-analog converter in order to adjust said timing, and said fourth step comprises adjusting the phase of clock signals applied to said second digital-to-analog converter in order to adjust said timing.

14. The device according to claim 12, wherein said device also executes:

a fifth step for adjusting timing by which are selected the output signals of said first and said second digital-to-analog converters such that when signals of a fifth predetermined frequency have been output as said synthesized signals, the level in the spectrum of said synthesized signals becomes lower than a fifth predetermined level or becomes the minimum for two frequency components that are separated by said fifth predetermined frequency from the frequency component that is the same as said sampling rate, wherein said second and fifth steps are repeated until said signal integrity value satisfies a predetermined condition.

15. The device according to claim 14, wherein said signal generator has a selector for selecting the output signals of said first and said second digital-to-analog converters, and said fifth step comprises changing the duty ratio of the signals applied to said selector for said selecting.

16. The device according to claim 11, wherein said first step is repeated until the signal integrity value, when signals of a second predetermined frequency have been output as said synthesized signals, satisfies a predetermined condition.

17. A device that is a signal generator for inter-leaving a first and a second digital-to-analog converter that operate under the same sampling frequency and outputting signals obtained by synthesizing output signals of said first and said second digital-to-analog converters, said device comprising a control device for adjusting the output offset of said first and said second digital-to-analog converters such that when a direct current of the same level is output from said first and said second digital-to-analog converters, or when signals that do not contain a frequency component of said sampling rate are output as said synthesized signals, the level in the spectrum of said synthesized signals of the frequency component that is the same as said sampling rate becomes lower than a predetermined value or becomes the minimum.

18. A device that is a signal generator for inter-leaving a first and a second digital-to-analog converter that operate under the same sampling rate and outputting signals obtained by synthesizing the output signals of said first and said second digital-to-analog converters, said device comprising a control device for adjusting the output level of said first and said second digital-to-analog converters such that when signals of a predetermined frequency have been output as said synthesized signals, the level in the spectrum of the synthesized signals becomes the same for two frequency components separated by said predetermined frequency from the frequency that is the same as said sampling rate; the difference between said two levels becomes less than a first predetermined value or becomes the minimum; or the sum of said two levels becomes less than a second predetermined value or becomes the minimum.

19. A device that is a signal generator for inter-leaving a first and a second digital-to-analog converter that operate under the same sampling rate and outputting signals obtained by synthesizing the output signals of said first and said second digital-to-analog converters, wherein said device comprises a control device for adjusting the timing with which are selected the output signals of said first and said second digital-to-analog converters such that when signals of a predetermined frequency have been output as synthesized signals, the level in the spectrum of said synthesized signals of two frequency components separated by said predetermined frequency from the frequency that is the same as said sampling rate becomes lower than a predetermined value or becomes the minimum.

20. A device that is a signal generator for inter-leaving a first and a second digital-to-analog converter that operate under the same sampling rate and outputting signals obtained by synthesizing the output signals of said first and said second digital-to-analog converters, wherein said device comprises a control device that executes the following steps comprising:

adjusting timing by which the output signals of said first digital-to-analog converter are renewed such that when signals of a first predetermined frequency have been output from said first digital-to-analog converter and a direct current has been output from said second digital-to-analog converter, the level of said first predetermined frequency component in the spectrum of said synthesized signals becomes the maximum; and adjusting the timing by which the output signals of said second digital-to-analog converter are renewed such that when a direct current has been output from said first digital-to-analog converter and signals of a second predetermined frequency have been output from said second digital-to-analog converter, the level of said second predetermined frequency component in the spectrum of said synthesized signals becomes the maximum.

* * * * *